United States Patent
Belyansky et al.

(10) Patent No.: US 6,562,713 B1
(45) Date of Patent: May 13, 2003

(54) METHOD OF PROTECTING SEMICONDUCTOR AREAS WHILE EXPOSING A GATE

(75) Inventors: Michael P. Belyansky, Bethel, CT (US); Omer H. Dokumaci, Wappinger Falls, NY (US); Bruce B. Doris, Brewster, NY (US); Hussein I. Hanafi, Basking Ridge, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/078,779

(22) Filed: Feb. 19, 2002

(51) Int. Cl.$^7$ .......................................... H01L 21/4763
(52) U.S. Cl. ........................................ 438/631; 438/697
(58) Field of Search ................................. 438/631, 689, 438/692, 700, 724, 725, 697, 760, 756, 755, 745, 744, 743

(56) References Cited

U.S. PATENT DOCUMENTS

| | | | |
|---|---|---|---|
| 4,502,202 A | 3/1985 | Malhi | 29/571 |
| 4,555,843 A | 12/1985 | Malhi | 29/571 |
| 4,564,584 A | 1/1986 | Fredericks et al. | |
| 4,728,617 A | 3/1988 | Woo et al. | 437/30 |
| 4,745,086 A | 5/1988 | Parrillo et al. | 437/57 |
| 5,453,389 A | 9/1995 | Strain et al. | 437/31 |
| 5,472,898 A | 12/1995 | Hong et al. | |
| 5,536,669 A | 7/1996 | Su et al. | |
| 5,665,621 A | 9/1997 | Hong | |
| 5,731,239 A | 3/1998 | Wong et al. | 438/296 |
| 5,828,102 A | 10/1998 | Bergemont | 257/342 |
| 5,856,225 A | 1/1999 | Lee et al. | 438/291 |
| 5,893,739 A | 4/1999 | Kadosh et al. | 438/286 |
| 6,008,096 A | 12/1999 | Gardner et al. | 438/300 |
| 6,060,345 A | 5/2000 | Hause et al. | |
| 6,060,358 A | 5/2000 | Bracchitta et al. | 438/259 |
| 6,060,364 A | 5/2000 | Maszara et al. | 438/305 |
| 6,110,818 A | 8/2000 | Haskell | 438/621 |
| 6,117,715 A | 9/2000 | Ha | |
| 6,133,102 A | 10/2000 | Wu | |
| 6,156,598 A | 12/2000 | Zhou et al. | |
| 6,239,008 B1 | 5/2001 | Yu et al. | |
| 6,251,731 B1 | 6/2001 | Wu | |
| 6,258,677 B1 | 7/2001 | Ang et al. | |
| 6,277,683 B1 | 8/2001 | Pradeep et al. | |
| 6,291,278 B1 | 9/2001 | Xiang et al. | |
| 6,365,523 B1 * | 4/2002 | Jang et al. | 438/692 |
| 6,368,988 B1 * | 4/2002 | Li et al. | 438/792 |
| 6,410,403 B1 * | 6/2002 | Wu | 438/424 |

FOREIGN PATENT DOCUMENTS

| | | |
|---|---|---|
| EP | 484128 | 5/1992 |
| JP | 06053507 A | 2/1994 |
| JP | 06204213 | 7/1994 |
| JP | 06349765 | 12/1994 |
| JP | 09312397 A | 12/1997 |

* cited by examiner

Primary Examiner—Viet Q. Nguyen
Assistant Examiner—David Nhu
(74) Attorney, Agent, or Firm—F.Chau & Associates, LLP

(57) ABSTRACT

Disclosed is a method of protecting semiconductor areas while exposing a gate for processing on a semiconductor surface, the method comprising depositing a planarizing high density plasma layer of a silicon compound, selected from the group silicon oxide and silicon nitride, in a manner effective in leaving an upper surface of said gate exposed. Also disclosed is a method of processing short gates while protecting long gates on a semiconductor surface, the method comprising depositing a planarizing layer of a silicon compound, selected from the group silicon nitride and silicon oxide, up to substantially the same height as said gates, and processing said semiconductor surface.

10 Claims, 4 Drawing Sheets

METHOD OF PROTECTING SEMICONDUCTOR AREAS WHILE EXPOSING A GATE

BACKGROUND OF THE INVENTION

1. Field of the Invention

This invention relates to a method of replacing, etching, or doping the gate, or similar structure, of a semiconductor device using a planarizing silicon oxide or nitride layer to protect surrounding semiconductor areas while the old gate is exposed and processed.

2. Discussion of the Related Art

Typically, when a semiconductor device gate is to be removed, etched, or doped or subjected to some other processing, the surrounding source and drain regions and other sensitive areas are protected by laying down a layer of tetraethoxysilane, tetraethylorthosilicate, tetraethelorthosilicate, or tetrethoxysilicide, any of which is referred to in the semiconductor art as TEOS. After deposition of TEOS, it is necessary to planarize the TEOS layer down to the gate so as to expose the gate for subsequent processing. The planarizing of the TEOS layer is usually accomplished by chemical mechanical polishing (CMP). Aside from the disadvantage of having to perform a CMP operation, this process has other disadvantages. For one, CMP operations cause dishing in the TEOS substrate when the gates are spaced relatively far apart. Dishing can lead to shorts developing between the gates in a replacement gate process. The shorts can develop because of the remaining metal on top of the TEOS after metal CMP.

SUMMARY OF THE INVENTION

Disclosed is a method of protecting semiconductor areas while exposing a gate for processing on a semiconductor surface, the method comprising depositing a planarizing high density plasma layer of a silicon compound, selected from the group silicon oxide and silicon nitride, in a manner effective in leaving an upper surface of said gate exposed.

In another aspect of the invention said deposition step further comprises depositing said silicon compound to a thickness substantially the same height of said gate, and the removal of any excess said silicon compound from atop said gate.

In another aspect of the invention said removal step further comprises depositing and patterning a resist layer to expose the top of said gate, etching away said excess silicon compound, and removing said resist layer.

In another aspect of the invention said depositing step is accomplished with a high density plasma chemical vapor deposition.

Disclosed is a method of processing short gates while protecting long gates on a semiconductor surface, the method comprising depositing a planarizing layer of a silicon compound, selected from the group silicon nitride and silicon oxide, up to substantially the same height as said gates, and processing said semiconductor surface.

In another aspect of the invention said deposition step is accomplished with a high density plasma chemical vapor deposition.

In another aspect of the invention said processing is a gate implant.

DETAILED DESCRIPTION OF PREFERRED EMBODIMENTS

Figure 1:
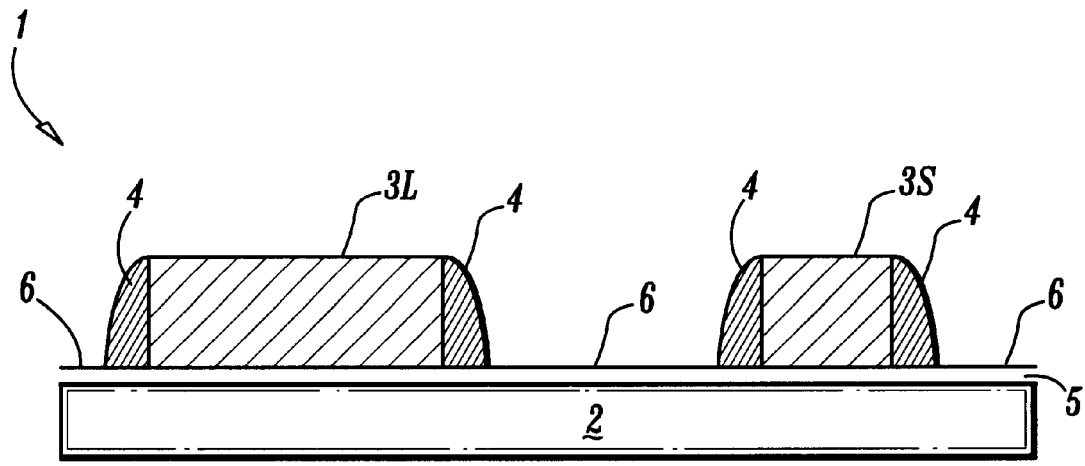
FIG. 1 shows a cross-section of a portion of a semiconductor wafer.

Referring to FIG. 1, there is shown a portion of a semiconductor wafer 1 having a typical gate structure thereon. The gate structure comprises polysilicon dummy gates 3, silicon nitride spacers 4 that act to separate the gates 3 from the source/drain areas 6 during doping, and a gate dielectric layer 5 upon a silicon substrate 2. Note that there may be long dummy gates 3L and short dummy gates 3S. The structure shown is for illustrative purposes only, the presence of the silicon nitride spacers 4 being purely optional, the teachings of the invention may be implemented any time after formation of the gates 3. The silicon substrate 2 may be any silicon-containing material, such as Si, SiGe, or SiC. Layered semiconductors such as Si/Ge/Si, Si/SiGe/Si, or silicon-on-insulator (SOI) may be employed. This substrate will contain the usual doped regions known in the art, such as the halo, extension, and source-drain regions. Isolation and well regions may also be installed. Silicide regions on top of the source-drain regions may also be present. Hence, the starting structure shown here in FIG. 1 is well known in the art.

Figure 2:
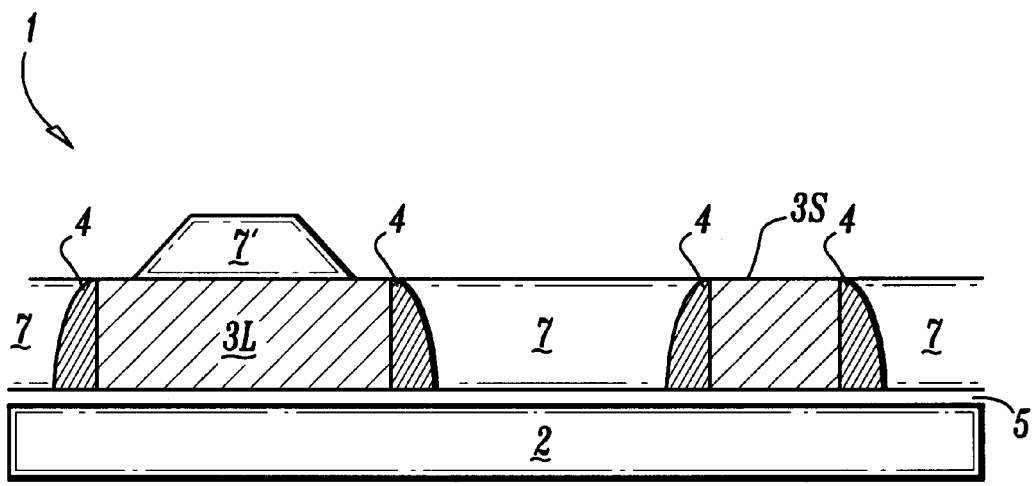
FIG. 2 shows the wafer of FIG. 1 after depositing a masking layer.

Referring to FIG. 2, a planarized masking layer 7 of silicon oxide or nitride is deposited up to a height substantially level to the top of the gates 3 using high density plasma deposition. This layer will be used to protect the source-drain regions 6 when we later etch out the dummy gates. The deposition is done with high density plasma chemical vapor deposition (HDP-CVD). When long structures are present, such as the long polysilicon gate 3L, there is substantial HDP excess 7 deposited on top of these structures, while only trace amounts may be found on the short gate 3S. This happens because maximum removal of the deposited material from the top of all structures occurs at the corners of the structures as a result of sputter etching. This so-called corner-faceting will usually remove most of the material from the top of smaller structures, but leave substantial thickness of material on longer and wider structures. The trace amounts of HDP way material on short gate 3S may be removed by a brief oxide etch, if desired.

HDP-CVD silicon nitride films may generally be formed by reacting silane gas ($SiH_4$) with either ammonia ($NH_3$) or nitrogen ($N_2$) gas in the presence of electromagnetic radiation and an inert gas, such as Argon (Ar) or Helium (He) for example, while HDP-CVD silicon oxide films may generally be formed by reacting silane gas ($SiH_4$) with oxygen ($O_2$) gas under similar of conditions.

Generally, the reaction pressure will be rather low, generally below ten mTorr and will usually be conducted in a magnetron sputtering environment. Under these conditions, the film being deposited begins to cover all the surfaces on the wafer conformally, including the sidewalls and bottoms of contact holes and trenches. Under normal CVD processes, this would cause an overhang at the rims of the trenches and holes that would eventually close off at the top, thereby leaving a cavity within. However, in HDP deposition the excitation of the inert gases and reactants into a high-energy plasma causes the deposited material to be continuously sputtered away even as it is being deposited. The result is that the deposited material behaves like a fluid and settles into the trenches and holes in a planarized, rather than conformal, manner and thereby avoiding the formation of any cavities.

HDP-CVD reactors will generally utilize a glow discharge to produce ions powerful enough to cause sputtering in the material being deposited. Glow discharges are a self-sustaining plasma produced by either or both of a dc-diode type system or an rf-diode system. An inert gas, such as Argon is introduced between a pair of electrodes with a strong enough electric field to ionize the reactant and inert gases to a plasma. Rf-diode systems are preferred because they can operate at significantly lower pressures and deliver higher deposition rates than dc-diode systems. A preferred rf-diode system will be equipped with a magnetron source so as to help confine electrons near the wafer surface. Commercially popular systems include those sold under the tradename Centura by Applied Materials.

Note that the deposition of silicon nitrides and oxides is conducted at low enough temperatures to avoid any damage to existing silicide structures.

Figure 3:
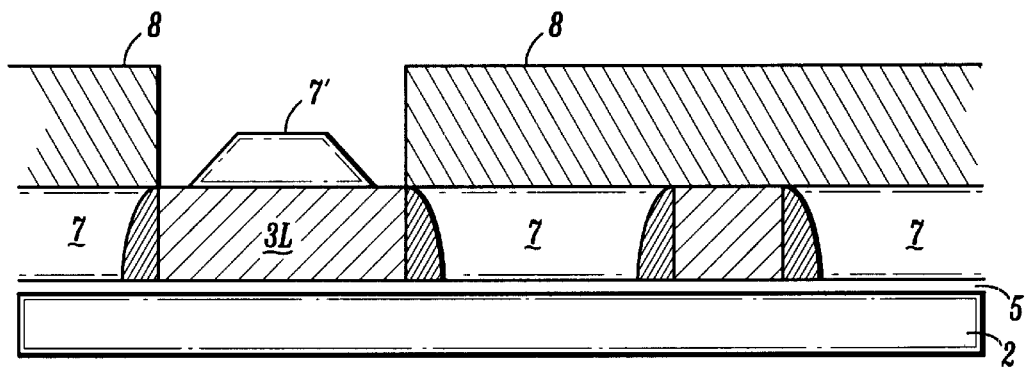
FIG. 3 shows the deposition and patterning of a resist layer.
Figure 4:
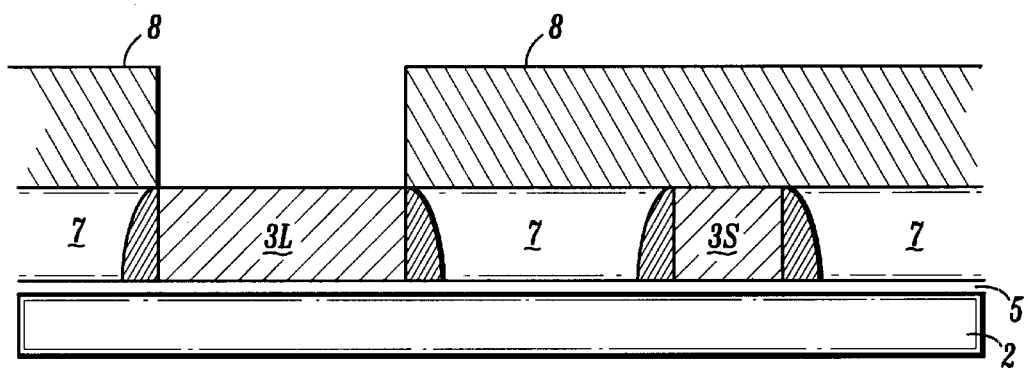
FIG. 4 shows the results of a etching the masking layer from the top of long gates.
Figure 5:
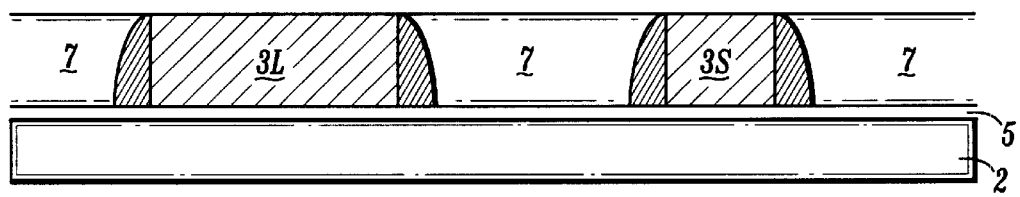
FIG. 5 shows the result of stripping away the resist layer of FIGS. 3 and 4.

FIGS. 3 through 5 show how the excess masking material 7' may be removed from atop of the long gates 3L. A resist layer 8 is deposited and lithographed to expose the long gates 3L. The excess masking material 7' may then be etched away with an etch selective with respect to the polysilicon gate 3L, as shown in FIG. 4. A dry etch will typically be used, though HF may be used for silicon oxide. The resist 8 is then stripped away, as in FIG. 5.

Figure 6:
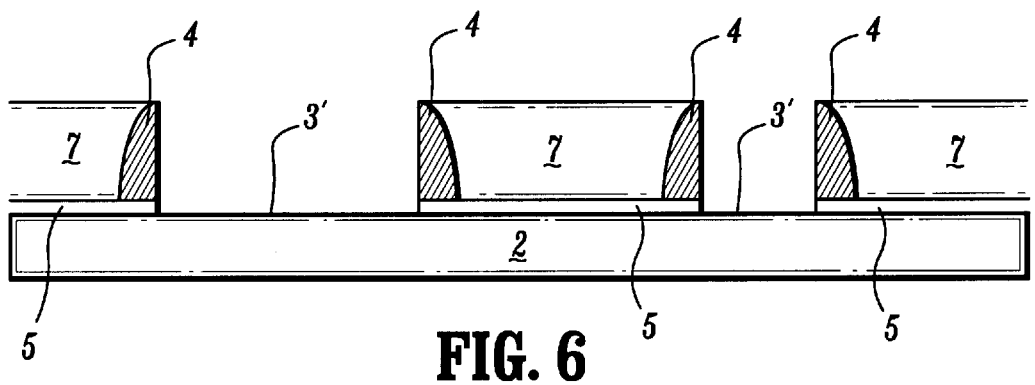
FIG. 6 shows the removal of dummy gates.
Figure 7:
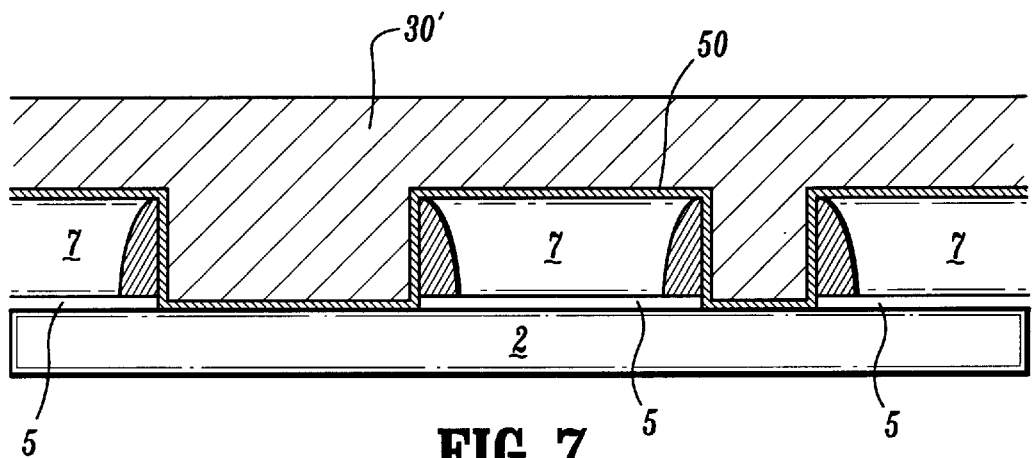
FIG. 7 shows the deposition of a dielectric layer and a gate material layer.
Figure 8:
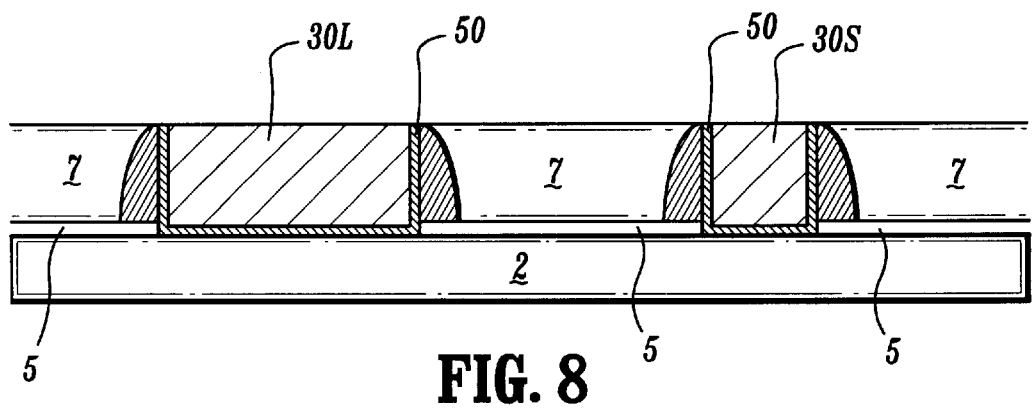
FIG. 8 shows the gate material of FIG. 7 after planarization.

FIGS. 6 through 8 show how the dummy gates 3 may now be safely replaced without damage to the source/drain areas 6. In FIG. 6, the polysilicon dummy gates 3 are removed with a process selective for the fill material that was chosen (i.e., oxide or nitride), yet effective in removing the polysilicon gates, thereby leaving gate cavities 3.

Suitable gas mixtures for use in a dry etching plasma process for etching polysilicon are those containing halogens. Chlorine ($Cl_2$), bromine ($Br_2$), and mixtures thereof are favored for their highly anisotropic etching properties. Fluorine ($F_2$) may also be used, but will also attack silicon oxides and is disfavored for its highly isotropic etching characteristics. Chlorine gas will slowly etch undoped polysilicon at low temperature even without ion bombardment and will etch swiftly and anisotropically in the plasma state. A drawback is that chlorine will etch n-doped polysilicon so rapidly that the sidewalls of polysilicon structures will be undercut if not protected. For this reason, photoresist masks are used or ethylhexafluoride ($C_2F_6$) is added to the reaction chamber so as to form a protective film on any exposed polysilicon sidewalls. Also, a microthin native oxide film often forms on polysilicon surfaces, this oxide film not everywhere uniform. This may result in uneven chlorine etching because of the great resistance of silicon oxides to chlorine plasma etching. This problem is often solved by a quick hydrofluoric (HF) acid bath prior to etching to strip off the very thin oxide films.

Bromine is becoming increasingly favored over chlorine for polysilicon etching because of its ability to react with etch by-products to form a passivating film on photoresist masks, amsilicon oxides, and polysilicon walls while providing anisotropic etching. Gasses used for bromine plasma etching comprise hydrobromic acid (HBr) alone, or in mixture with oxygen, or in mixture with oxygen and chlorine. The addition of oxygen improves anisotropy. Bromine residues remain after the etch, but these may be removed by subsequent exposure of the wafer to an oxygen plasma.

In practice, a polysilicon plasma etch is usually three etches. A first etch, usually a fluorine etch or HF dip, to remove any native oxide on the top surfaces of the polysilicon structure. Secondly, the main polysilicon plasma etch, with chlorine and or bromine. Lastly, a cleanup etch to remove residual reactants and polysilicon stringers.

After the poly etch, the oxide layer underneath is removed with an HF etch.

Referring to FIG. 7, a dielectric layer 50 is blanket deposited or grown, on top of which is deposited a replacement gate material 30' to fill the gate cavities 3', which are now lined with dielectric 50. The new gate materials 30L, 30S may be of any material effective as a gate as the occasion demands, such as polysilicon, metal, or silicide. Typical deposited dielectrics are high-k materials or silicon nitride. Typical grown dielectrics will be silicon oxides, silicon nitrides, or silicon oxynitrides.

To install a new polysilicon gate, commonly used precursors for epitaxial polysilicon growth comprise silicon tetrachloride ($SiCl_4$), trichlorosilane ($SiHCl_3$), dichlorosilane ($SiH_2Cl_2$), monosilane ($SiH_4$), and disilane ($Si_2H_6$) the latter four being favored for producing thinner, layers at lower deposition temperatures than silicon tetrachloride. Germanes may be added to the silanes to grow silicon-germanium alloy.

The precursors will generally be introduced into a reaction chamber accompanied by a large excess of hydrogen gas, which acts both as a reducing agent and as a diluent for the precursor. The rate of growth will, vary positively with temperature, pressure, and reactant concentration. Reaction conditions being equal, the rate of growth will depend upon the precursor used in the order from fastest to slowest of $Si_2H_6 > SiH_4 > SiH_2Cl_2 > SiHCl_3 > SiCl_4$.

Suitable metals for use as gate materials include tungsten, molybdenum, aluminum, titanium, titanium nitride, and tantalum nitride. The main advantage of metal gates over polysilicon gates is that there are no poly depletion effects in metal gates. The gate capacitance of a metal gate is larger, which yields to higher drive currents and faster transistors. Further, metal gates exhibit electrical resistances one to two orders of magnitude lower than silicon-based gates.

Tungsten and molybdenum are typically deposited by a blanket chemical vapor deposition (CVD) in a conformal layer over the wafer, This may be accomplished using a metal halide, preferably $WF_6$ or $MoF_3$ in a sputtering reactor in the presence of gaseous hydrogen or silane. A problem with hydrogen reduction is that the deposition rate is very slow. However, reduction with silane gives poor enough step coverage that one may expect voids to form in the gate as the deposited metal builds up on the walls of the gate channel. The solution is to utilize a two-step process wherein a silane reduction CVD is first performed, followed by a hydrogen reduction to fill any remaining voids. The silane reduction will typically be carried out at pressures of about 1 torr, while the hydrogen reduction will preferably be carried out at pressures of 25 to 80 torr. Executing the hydrogen reduction CVD at higher pressures improves step coverage. In general, the tungsten or molybdenum CVD will be conducted at temperatures of about 400° C. to 450° C. Alternatively, one may obtain good results with a single $SiH_2F_2$ reduction CVD.

Titanium (Ti) and Titanium nitride (TiN) may be deposited by either physical vapor deposition (PVD) or chemical vapor deposition (CVD), the latter generally preferred where better step coverage is desired. Chemical vapor deposition of conformal TiN may be accomplished by reacting either titanium chloride ($TiCl_4$) or tetrakis-dimethylamido-titanium $\{Ti[N(CH_3)_2)]_4\}$ with ammonia in an LPCVD reactor at temperatures of about 600° C. or more for titanium chloride depositions and about 400° C. for tetrakis-dimethylamido-titanium (TDMAT) depositions. It is also known to use tetrakis-diethylarnido-titanium $\{Ti[N(C_2H_2CH_3)_2)]_4\}$ by direct liquid injection into the reaction chamber, whereupon it immediately vaporizes because of its extremely low vapor pressure.

Aluminuni may be deposited in an LPCVD reactor by the pyrolysis of tri-isobutyl aluminum $[Al(C_4H_9)_3]$, trimethyl aluminum $[Al_2(CH_3)_6]$, dimethyl aluminum hydride $[AlH:(CH_3)_2]$, or dimethylamine alane $[AlH_3:NC_2H_5(CH_3)_2]$. The latter three precursors posses aluminum-hydrogen bonds that are easily dissociated at temperatures below 200° C. to leave aluminum films of high purity. Reaction pressures are typically at 100 to 200 torr. Advantages of aluminum gates over tungsten or molybdenum include lower resistivity and planarizing deposition.

Metal suicides useful as gate materials include tungsten ($WSi_x$), tantalum ($TaSi_2$), and Molybdenum ($MoSi_2$) suicides. Tungsten silicide is the most popular of the suicides at present and, when deposited using chemical vapor deposition (CVD), produces films of high purity at good throughput that exhibit good wafer-to-wafer and run-to-run uniformity.

Tungsten silicide may be deposited by reacting tungsten fluoride ($WF_4$) with silane ($SiH_4$) in a CVD reactor at 300 to 400° C. at pressures of from 50 to 300 mtorr. Hence, the deposition will often fall into that class known as low pressure chemical vapor depositions (LPCVD). Hydrofluoric (HF) and hydrogen gasses are byproducts of the reaction. To ensure that tungsten silicide, rather than tungsten metal, is deposited it is desirable to provide a high flow rate of silane into the reactor, preferably at least about two moles of silane per mole of tungsten fluoride, still more preferably at least about ten moles of silane per mole of tungsten fluoride. High silane flow also ensures the deposition of excess silicon forming in the grain boundaries of the film, which is desirable to protect the underlying layer from being consumed by the reaction. Generally, a flow rate of ten or more moles of silane for each mole of tungsten fluoride may be expected to produce a $WSi_x$ deposition with x ranging from about 2.2 to 2.6.

Another method of producing tungsten silicide depositions is the reaction of tungsten fluoride gas with dichlorosilane ($SiH_2Cl_2$) in an LPCVD reactor at temperatures of 570 to 600° C. This process produces a tungsten silicide film exhibiting much lower fluorine contamination and superior step coverage than films formed by the above silicide process.

Chemical vapor deposition of tungsten silicide is preferably carried out in cold-wall reactors.

After deposition of the tungsten silicide gate, it is desirable to subject the gate to rapid thermal processing (RTP) in order to anneal the silicide and thereby reduce the resistance of the gate. RTP will typically reduce the resistance of a tungsten silicide deposition by an order of magnitude. The actual resistivity of the film will also be dependent upon the amount of excess silicon, with resistance increasing with increasing Si concentration.

Rapid thermal process (RTP) furnaces are commercially available from such companies as Applied Materials and AG Associates, among others. Preferred RTP systems will maintain uniform temperature across the width of the wafer during the rapid ramping-up and cooling down of temperature and will have an accurate means of measuring the wafer temperature so as to control it. A typical Applied Materials RTP will have a water-cooled reaction chamber, an array of heating lamps, such as halogen lamps, and a fiber optic temperature probe. The halogen lamps will generally be arrayed above the wafer and have their light directed downward by collimating light pipes, often with a quartz or fused silica window separating the lamps from the reaction chamber. This allows rapid heating and the ability to isolate the chamber so as to evacuate it. The wafer sits upon an insulative rotating base, the rotation effective in smoothing out any gas flow and light variations. Pyrometers are usually mounted below the wafer and measure temperature radiating off the back of the wafer at regular intervals, typically 20 times per second, thereby allowing precise computer control over the ramp-up and cool-off of the wafer.

Referring to FIG. 8, after deposition of the gate material, the gate material is planarized to the gate level with CMP.

Figure 9:
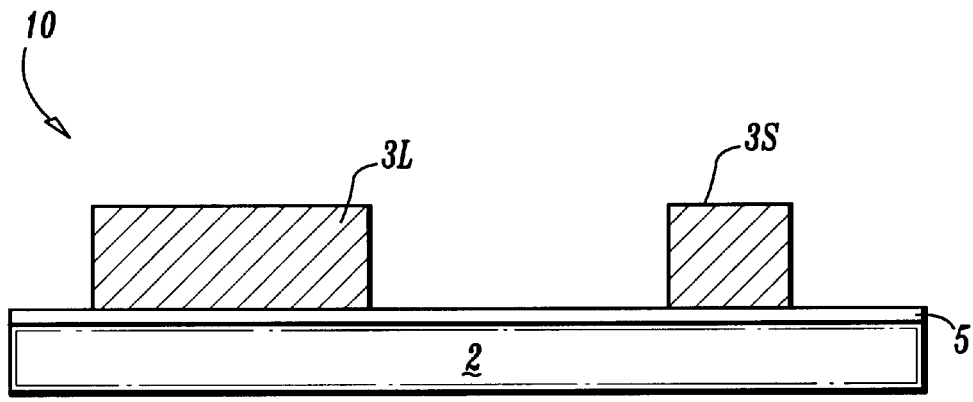
FIG. 9 shows a cross-section of a portion of another semiconductor wafer.

Referring to FIG. 9, in another embodiment of the invention, there is shown a starting structure 10 comprising a gate dielectric 5 atop a substrate 2. The substrate may be of any silicon-containing.semiconductor material such as silicon, SiGe, and SiC. Layered substrates such as SiGe/Si, Si/SiGe/Si and silicon-on-insulators (SOI) may be employed. The substrate may contain typical doped regions such as halo, extension, and source-drain regions, as well as isolation and well regions. The gate dielectric 5 may be silicon oxide, silicon nitride, silicon oxynitride, or other high-k material. Polysilicon gates 3 are provided, typically made of silicon, SiGe, SiGeC or combinations thereof. Silicon nitride spacers may be provided, but are not necessary and are omitted from this set of drawings. Hence, this drawing is known in the art and substantially identical to FIG. 1 save for the lack of spacers.

Figure 10:
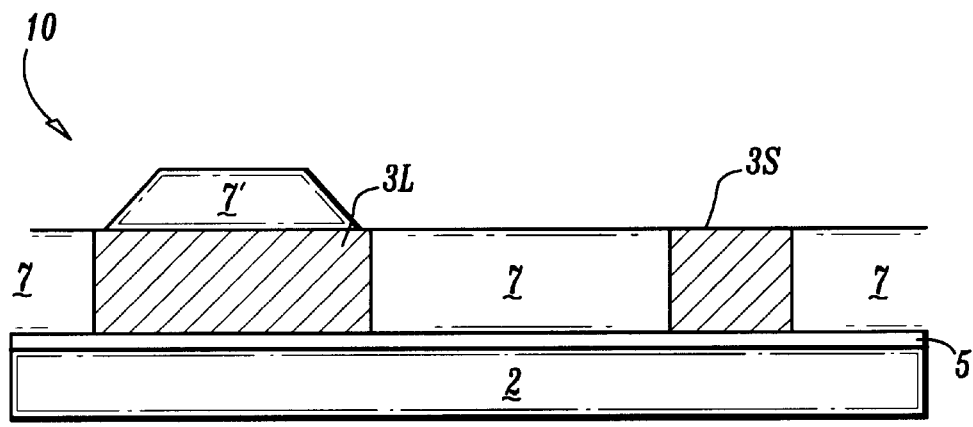
FIG. 10 shows the deposition of a masking layer upon the wafer of FIG. 9

Referring to FIG. 10, a planarizing masking material 7, either silicon oxide or silicon nitride, is deposited, again resulting in excess deposition 7' upon the long gates 3L. As before, an optional oxide etch may be performed to remove any trace depositions upon the short gates 3S.

Figure 11:
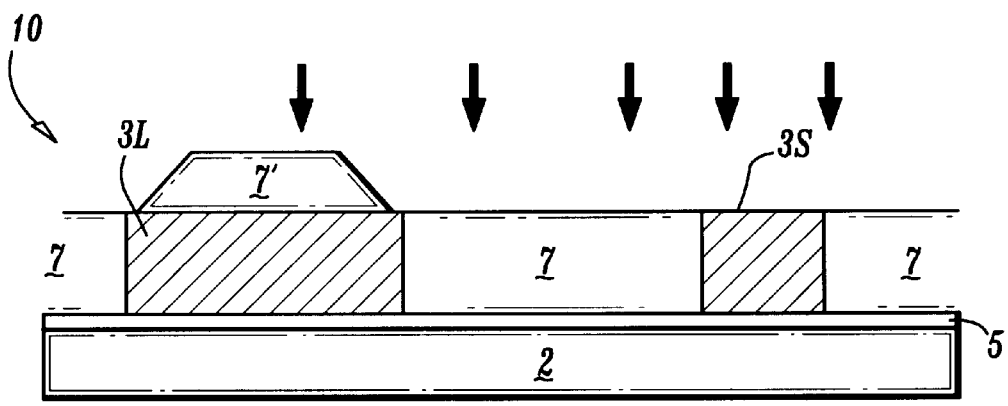
FIG. 11 shows a gate implant.

Referring to FIG. 11, a gate implant is now performed. The implant will typically be arsenic (As) or phosphorous (P) for n-type devices, or boron (B) or boron diflouride ($BF_2$) for p-type devices. The dose of the implants will typically be $1 \times 10^{15}$ to $5 \times 10^{16}$ at energies of 1 KeV to 100 KeV. Note, however, that only the short gates 3S will be implanted and activated because the long gates 3L are blocked by the mask material excess 7'. An optional thermal anneal may be performed for a period of from about 0.1 seconds to about an hour at a temperature between about 800° C. and about 1200° C. in an inert atmosphere, such as nitrogen, argon, or helium, or in an oxidizing atmosphere of oxygen or any combination thereof.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of protecting semiconductor areas while exposing a gate for processing on a semiconductor surface, the method comprising:

depositing a planarizing high density plasma layer of a silicon compound, selected from the group silicon oxide and silicon nitride, in a manner effective in leaving an upper surface of said gate exposed.

2. The method of claim 1 wherein said deposition step further comprises:

depositing said silicon compound to a thickness substantially the same height of said gate; and the removal of any excess said silicon compound from atop said gate.

3. The method of claim 2 wherein said removal step further comprises:

depositing and patterning a resist layer to expose the top of said gate;

etching away said excess silicon compound; and removing said resist layer.

4. The method of step 1 wherein said depositing step is accomplished with a high density plasma chemical vapor deposition.

5. A method of processing short gates while protecting long gates on a semiconductor surface, the method comprising:

depositing a planarizing layer of a silicon compound, selected from the group silicon nitride and silicon oxide, up to substantially the same height as said gates using a high density plasma chemical vapor deposition; and processing said semiconductor surface.

6. The method of claim 5, wherein said processing is a gate implant.

7. A method of protecting semiconductor areas while exposing a gate for processing on a semiconductor surface, the method comprising:

depositing a planarizing high density plasma layer of a silicon compound on a dielectric layer and abutting sidewalls of the gate using high density plasma chemical vapor deposition, wherein said plasma layer is substantially level with the top horizontal surface of the gate.

8. The method of claim 7, wherein the silicon compound is from the group of silicon oxide and silicon nitride.

9. The method of claim 7, wherein said deposition step further comprises:

removing of any excess said silicon compound from the top horizontal surface of the gate.

10. The method of claim 9, wherein said removal step further comprises;

depositing and patterning a resist layer to expose the top of said gate;

etching away said excess silicon compound; and removing said resist layer.

* * * * *